(12) United States Patent
Guo et al.

(10) Patent No.: US 12,114,532 B2
(45) Date of Patent: Oct. 8, 2024

(54) DISPLAY SUBSTRATE AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Yonglin Guo, Beijing (CN); Hongmei Fan, Beijing (CN); Xinyu Wei, Beijing (CN); Yuqian Pang, Beijing (CN); Kai Zhang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 448 days.

(21) Appl. No.: 17/628,942

(22) PCT Filed: Mar. 9, 2021

(86) PCT No.: PCT/CN2021/079653
§ 371 (c)(1),
(2) Date: Jan. 21, 2022

(87) PCT Pub. No.: WO2021/218390
PCT Pub. Date: Nov. 4, 2021

(65) Prior Publication Data
US 2022/0262882 A1  Aug. 18, 2022

(30) Foreign Application Priority Data
Apr. 30, 2020  (CN) .................... 2020 10360547.8

(51) Int. Cl.
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02);
(Continued)

(58) Field of Classification Search
CPC ..... H10K 59/121–1216; G09G 3/3655; G09G 2300/0819–0823
See application file for complete search history.

(56) References Cited

U.S. PATENT DOCUMENTS

| 8,754,914 B2 | 6/2014 | Lu |
| 2003/0142054 A1 | 7/2003 | Tada |
| 2005/0184980 A1 | 8/2005 | Sato et al. |

FOREIGN PATENT DOCUMENTS

| CN | 101211044 A | 7/2008 |
| CN | 202267803 U | 6/2012 |

(Continued)

OTHER PUBLICATIONS

China Patent Office, CN202010360547.8 First Office Action issued on Dec. 28, 2020.

*Primary Examiner* — Amar Movva
(74) *Attorney, Agent, or Firm* — HOUTTEMAN LAW LLC

(57) ABSTRACT

Provided is a display substrate, including a base substrate and a plurality of pixel units arranged on the base substrate; each pixel unit includes constant voltage terminals and a dual-gate transistor; a part of an active region of each dual-gate transistor, which is located between two gates, is an intermediate part; except the pixel units closest to the first side, each pixel unit includes a compensation structure; the compensation structure is connected to one of the constant voltage terminals of the pixel unit where the compensation structure is located, and compensates for at least one dual-gate transistor of a pixel unit adjacent to the pixel unit where the compensation structure is located in a direction toward (Continued)

the first side; the compensation structure overlaps and is insulated from the intermediate part of the dual-gate transistor for which the compensation structure compensates.

20 Claims, 6 Drawing Sheets

(52) U.S. Cl.
CPC .............. *G09G 2300/0819* (2013.01); *G09G 2300/0823* (2013.01)

(56) References Cited

FOREIGN PATENT DOCUMENTS

| | | | |
|---|---|---|---|
| CN | 104821339 | A | 8/2015 |
| CN | 105573549 | A | 5/2016 |
| CN | 106875893 | A | 6/2017 |
| CN | 107591124 | A | 1/2018 |
| CN | 110085170 | A | 8/2019 |
| CN | 110164380 | A | 8/2019 |
| CN | 111429843 | A | 7/2020 |

DISPLAY SUBSTRATE AND DISPLAY DEVICE

CROSS-REFERENCE TO RELATED APPLICATIONS

This is a National Phase Application filed under 35 U.S.C. 371 as a national stage of PCT/CN2021/079653, filed on Mar. 9, 2021, an application claiming the priority of Chinese Patent Application No. 202010360547.8, filed on Apr. 30, 2020, the contents of which are incorporated herein in their entirety by reference.

TECHNICAL FIELD

Embodiments of the present disclosure relate to the field of display technology, and in particular, to a display substrate and a display device.

BACKGROUND

Each pixel unit is typically provided therein with a plurality of transistors configured to transmit signals to perform a display function. When a state of a transistor is unstable, the signal transmitted through the transistor may change, which further affects a display effect of the pixel unit.

SUMMARY

The embodiments of the present disclosure provide a display substrate and a display device, which at least partially solve the technical problem in the related art that the display effect is affected due to unstable states of a part of dual-gate transistors in a conventional display substrate.

In a first aspect, an embodiment of the present disclosure provides a display substrate, including a base substrate and a plurality of pixel units arranged in an array on the base substrate, and the array has a first side and a second side, which are opposite to each other; each pixel unit includes at least one constant voltage terminal and at least one dual-gate transistor, and each dual-gate transistor includes two gates which are spaced apart, and a part of an active region of the dual-gate transistor, which is located between the two gates, is an intermediate part; except the pixel units closest to the first side, each pixel unit further includes a compensation structure, and the compensation structure is connected to one constant voltage terminal of the pixel unit where the compensation structure is located, and compensates for the at least one dual-gate transistor of a pixel unit adjacent to, in a direction toward the first side, the pixel unit where the compensation structure is located; the compensation structure overlaps and is insulated from the intermediate part of the dual-gate transistor for which the compensation structure compensates, and the compensation structure and the two gates of the dual-gate transistor for which the compensation structure compensates are located on a same side of the active region of the dual-gate transistor with respect to the base substrate; and the pixel units closest to the second side are redundant pixel units which are not used for display.

In some embodiments, each pixel unit further includes a first constant voltage terminal, a second constant voltage terminal, a driving transistor and a light-emitting device which are connected in series between the first constant voltage terminal and the second constant voltage terminal; the driving transistor is configured to control a current flowing through the driving transistor according to a voltage of a gate of the driving transistor; and the light-emitting device of the redundant pixel unit does not have a light emitting function.

In some embodiments, the light-emitting device is an organic light-emitting diode.

In some embodiments, the compensation structure is connected to the first constant voltage terminal of the pixel unit where the compensation structure is located.

In some embodiments, the compensation structure is connected to the second constant voltage terminal of the pixel unit where the compensation structure is located.

In some embodiments, each pixel unit includes a first dual-gate transistor; a first electrode of the first dual-gate transistor is connected to the gate of the driving transistor; and the first dual-gate transistor is configured to transmit a data voltage to the gate of the driving transistor; and except the redundant pixel units, the first dual-gate transistor of each pixel unit is compensated by the compensation structure.

In some embodiments, a second electrode of the first dual-gate transistor is connected to a second electrode of the driving transistor.

In some embodiments, each pixel unit further includes a data terminal, a gate line terminal, a control terminal, a switch transistor, a first control transistor, a second control transistor, and a storage capacitor; the first control transistor includes a gate connected to the control terminal, a first electrode connected to the first constant voltage terminal, and a second electrode connected to a first electrode of the driving transistor; the second control transistor includes a gate connected to the control terminal, a first electrode connected to the second electrode of the driving transistor, and a second electrode connected to a first electrode of the light-emitting device; a second electrode of the light-emitting device is connected to the second constant voltage terminal; the switch transistor includes a gate connected to the gate line terminal, a first electrode connected to the first electrode of the driving transistor, and a second electrode connected to the data terminal; gates of the first dual-gate transistor are connected to the gate line terminal; and the storage capacitor includes a first electrode connected to the first constant voltage terminal, and a second electrode connected to the gate of the driving transistor.

In some embodiments, each pixel unit further includes an initial signal terminal, a reset terminal, a first reset transistor, and a second reset terminal; the first reset terminal includes a gate connected to the reset terminal, a first electrode connected to the gate of the driving transistor, and a second electrode connected to the initial signal terminal; and the second reset terminal includes a gate connected to the reset terminal, a first electrode connected to the first electrode of the light-emitting device, and a second electrode connected to the initial signal terminal.

In some embodiments, the plurality of pixel units in the array are arranged in rows and columns; each row of pixel units is connected to one gate line, and each column of pixel units is connected to one data line; a direction from the first side to the second side is parallel to a direction of the rows; and the pixel units in the column closest to the second side are the redundant pixel units.

In a second aspect, an embodiment of the present disclosure provides a display device, including the display substrate described above.

In some embodiments, the display device further includes: a frame disposed on a light emitting side of the display substrate; and an orthographic projection of the frame on the display substrate covers the redundant pixel units, but does not overlap the other pixel units except the redundant pixel units.

BRIEF DESCRIPTION OF DRAWINGS

The accompanying drawings are used to provide a further understanding of the present disclosure, and are incorporated in and constitute a part of the specification. The drawings are used to explain the present disclosure in conjunction of the embodiments of the present disclosure, but do not constitute any limitation to the present disclosure. The above and other features and advantages will become more apparent to those of ordinary skill in the art through the description of the specific exemplary embodiments with reference to the drawings. In the drawings.

DETAIL DESCRIPTION OF EMBODIMENTS

Figure 1:
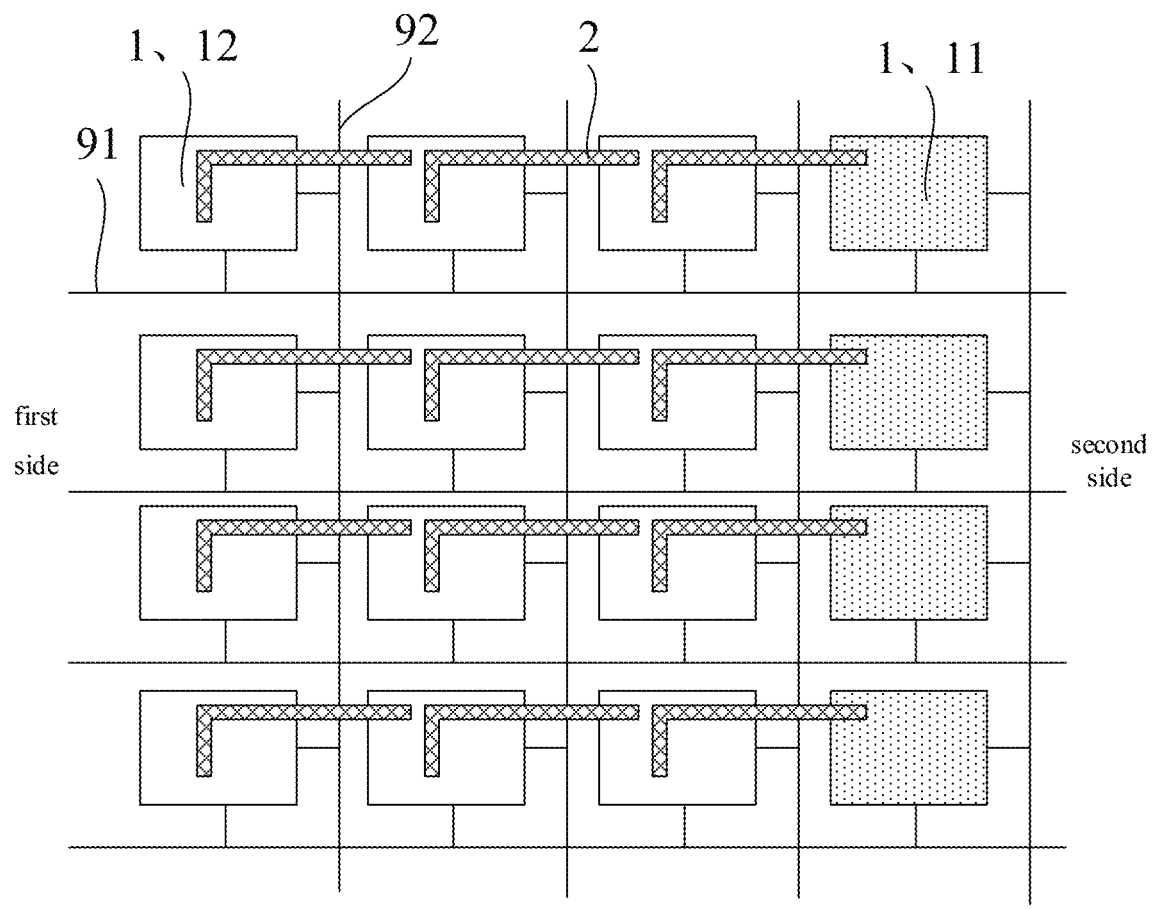
FIG. 1 is a top view of a structure of a display substrate according to the present disclosure.

In order to enable those of ordinary skill in the art to better understand technical solutions of the embodiments of the present disclosure, the display substrate and the display device provided by the embodiments of the present disclosure are further described in detail below with reference to the drawings.

The embodiments of the present disclosure will be described more fully below with reference to the drawings, but the embodiments illustrated herein may be embodied in different forms and should not be interpreted as being limited to the embodiments described herein. Rather, the embodiments are provided to make the present disclosure thorough and complete, and are intended to enable those of ordinary skill in the art to fully understand the scope of the present disclosure.

The embodiments of the present disclosure can be described with reference to plans and/or cross-sectional views with the aid of idealized schematic diagrams of the present disclosure. Accordingly, the exemplary drawings may be modified in accordance with manufacturing techniques and/or tolerances.

The embodiments of the present disclosure and the features thereof may be combined with one another if no conflict is incurred.

Unless otherwise defined, all terms (including technical terms and scientific terms) used herein have the same meaning as commonly understood by those of ordinary skill in the art. It should be also understood that terms, such as those defined in commonly used dictionaries, should be interpreted as having a meaning that is consistent with a meaning in the context of the related art and the present disclosure, and should not be interpreted in an idealized or overly formal sense unless expressly so defined herein.

The embodiments of the present disclosure are not limited to those illustrated by the drawings, but include modifications to configuration formed based on a manufacturing process. Thus, the regions shown in the drawings are illustrative, and the shapes of the regions shown in the drawings illustrate specific shapes of the regions of the elements, but are not intended to make limitations.

In a first aspect, the present disclosure provides a display substrate.

The display substrate provided in the present disclosure is a substrate used in a display device to perform a display function, for example, the display substrate may be an array substrate of an Organic Light-Emitting Diode (OLED) display.

The display substrate provided in the present disclosure includes a base substrate 8 and a plurality of pixel units 1 arranged in an array on the base substrate 8, and the array has a first side and a second side, which are opposite to each other.

Each pixel unit 1 includes at least one constant voltage terminal and at least one dual-gate transistor; and each dual-gate transistor includes two gates 51 which are spaced apart, and a part of an active region 52 of the dual-gate transistor, which is located between the two gates 51, is an intermediate part 521.

Except the pixel units 1 closest to the first side, each pixel unit 1 further includes a compensation structure 2. The compensation structure 2 is connected to one constant voltage terminal of the pixel unit 1 where the compensation structure 2 is located, and compensates for the at least one dual-gate transistor of a pixel unit 1 adjacent to, in a direction toward the first side, the pixel unit 1 where the compensation structure 2 is located. The compensation structure 2 overlaps and is insulated from the intermediate part 521 of the dual-gate transistor for which the compensation structure 2 compensates, and the compensation structure 2 and the two gates 51 of the dual-gate transistor for which the compensation structure 2 compensates are located on a same side of the active region 52 of the dual-gate transistor with respect to the base substrate 8. The pixel units 1 closest to the second side are redundant pixel units 11 which are not used for display.

With reference to FIG. 1, the display substrate includes a plurality of pixel units 1 disposed on the base substrate 8. Each pixel unit 1 is the minimum unit which can independently control the display content of the pixel unit 1, and the pixel unit 1 is also called a sub-pixel or a pixel. The plurality of pixel units 1 are arranged in an array, so as to display a desired image together.

The above array has a first side and a second side, which are opposite to each other, such as the left side and the right side shown in FIG. 1.

Each pixel unit 1 is provided therein with a pixel circuit used for display, and the pixel circuit includes a plurality of transistors, at least one of which is a transistor in a dual-gate type (i.e., the dual-gate transistor).

Figure 2:
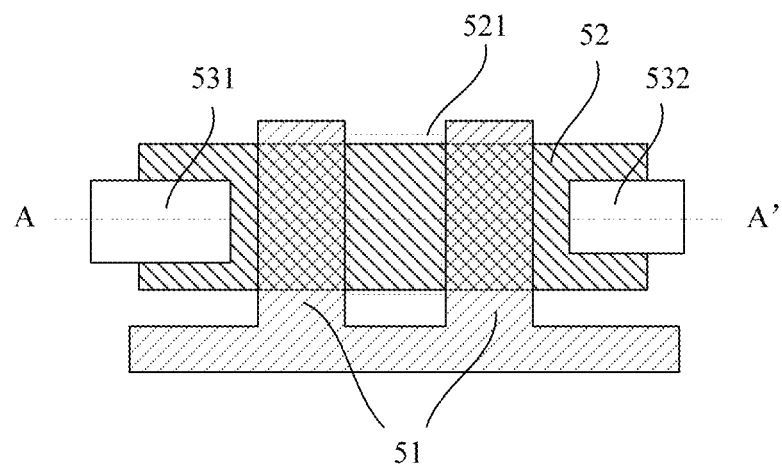
FIG. 2 is a top view of a structure of a dual-gate transistor in the related art.
Figure 3:
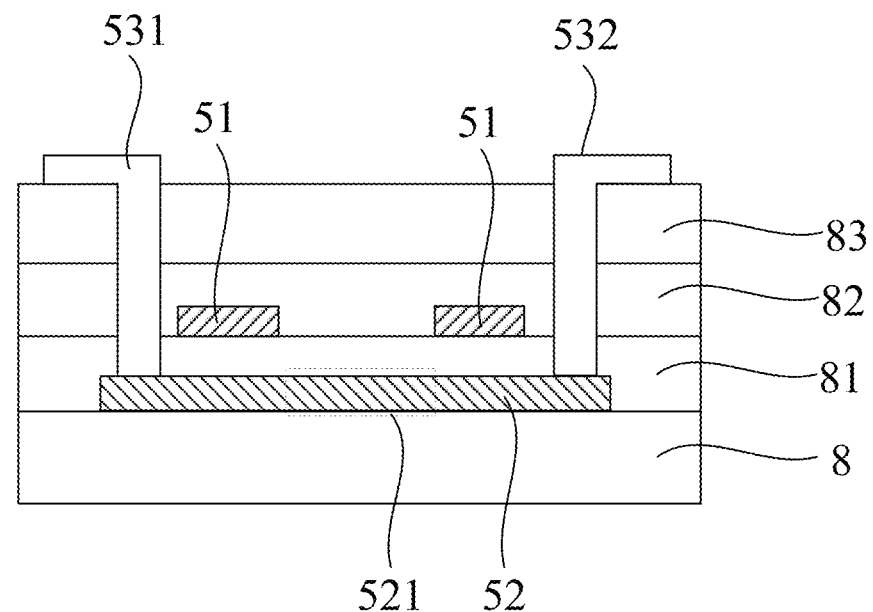
FIG. 3 is a sectional structure diagram of FIG. 2 taken along line AA'.

With reference to FIG. 2 and FIG. 3, the dual-gate transistor has the active region 52, and both ends of the active region 52 are respectively connected to a source 531 and a drain 532 (i.e., a first electrode and a second electrode of the transistor). The dual-gate transistor further includes two gates 51 which are spaced apart, and the two gates 51 are electrically connected to each other and thus always receive a same signal. Thus, a part (channel) of the active region 52 between the source 531 and the drain 532 overlaps both of the gates 51 and is insulated from the gates 51 by a gate insulating layer 81, and another part of the active region 52 corresponding to a space between the two gates 51 is referred to as the intermediate part 521 of the dual-gate transistor.

Figure 4:
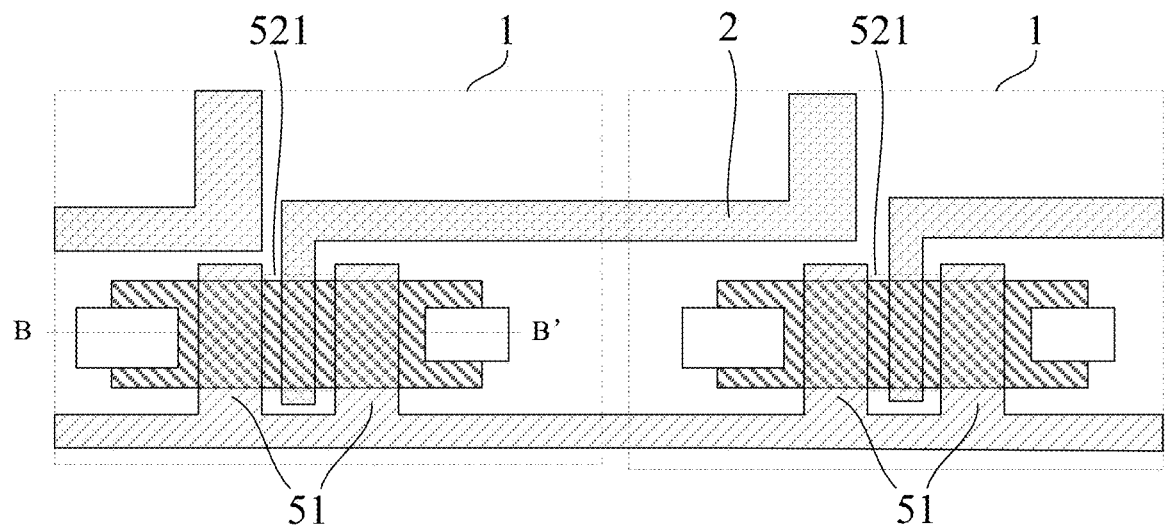
FIG. 4 is a top view of a part of a structure of a dual-gate transistor and a compensation structure in a part of pixel units of a display substrate according to the present disclosure.

With reference to FIG. 1 and FIG. 4, except the pixel units 1 closest to the first side (e.g., the leftmost column of pixel units 1 in FIG. 1), each pixel unit 1 further includes a "compensation structure 2", and the compensation structure 2 is connected to a constant voltage terminal of the pixel unit 1 where the compensation structure 2 is located, and thus has a fixed voltage during operation.

Meanwhile, with reference to FIG. 1 and FIG. 4, the compensation structure 2 of each pixel unit 1 extends into a pixel unit 1 adjacent to the pixel unit 1 with respect to a direction toward the first side (e.g., the compensation structure 2 of each pixel unit 1 extends into the pixel unit 1 on the left side of the pixel unit 1 in FIG. 1) and compensates for the dual-gate transistor in the adjacent pixel unit 1.

Figure 5:
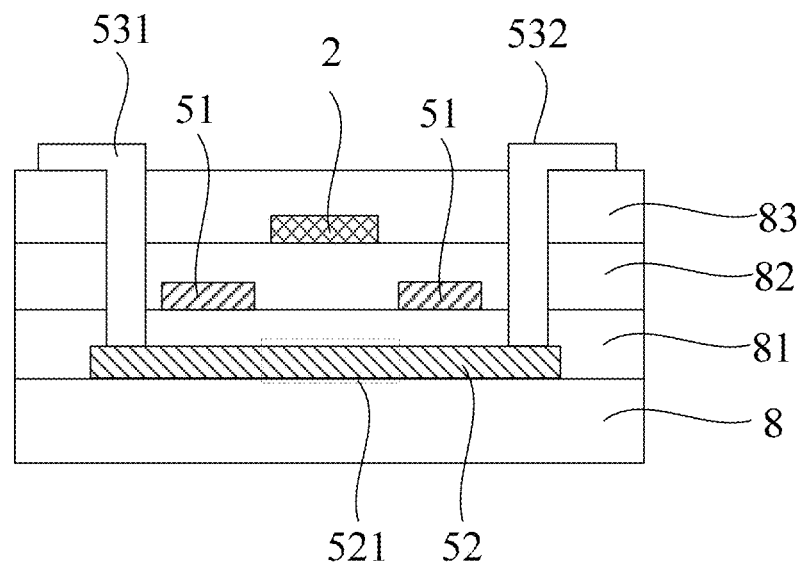
FIG. 5 is a sectional structure diagram of FIG. 4 taken along line BB'.

With reference to FIG. 4 and FIG. 5, compensating for the dual-gate transistor by the compensation structure 2 stated above refers to that the compensation structure 2 overlaps the intermediate part 521 (i.e., the part between the two gates 51) of the active region 52 of the compensated dual-gate transistor, and the compensation structure 2 and the intermediate part 521 are insulated from each other (e.g., by an insulating layer).

In addition, the compensation structure 2 and the gates 51 of the compensated dual-gate transistor are located on the same side of the active region 52 of the dual-gate transistor with respect to the base substrate 8 (i.e., the side where external light may enter, the upper side of the active region 52 in FIG. 5). For example, the compensation structure 2 and the gates 51 of the compensated dual-gate transistor are all located on a side of the active region 52 close to the base substrate 8, or on a side of the active region 52 away from the base substrate 8.

A top-gate transistor is taken as an example of the dual-gate transistor in FIG. 3 and FIG. 4, that is, the gates 51 are located on the side of the active region 52 away from the base substrate 8; therefore, the compensation structure 2 in FIG. 4 is also located on the side of the active region 52 away from the base substrate 8, and the external light are incident in the side of the active region 52 away from the base substrate 8 (that is, the external light is incident downwards in FIG. 4). Meanwhile, the display substrate further includes other structures such as a first interlayer insulating layer 81 and a second interlayer insulating layer 82, which will be described in detail later.

It is also possible that the dual-gate transistor is a bottom gate type transistor, or the other structures of the dual-gate transistor are in different forms.

With reference to FIG. 4, after being connected to a constant voltage terminal of the pixel unit 1, the compensation structure 2 may specifically extend along the direction toward the first side (e.g., the left side) to enter an adjacent pixel unit 1 with respect to the first side, and is disposed overlapping the intermediate part 521 of the active region 52 of a corresponding first transistor.

From which part of a lead the compensation structure 2 is led out and along which path the compensation structure 2 enters the adjacent pixel unit 1 with respect to the direction toward the first side may be specifically implemented in various ways, and the specific implementations will not be described in detail herein.

For clarity, FIG. 4 only shows the compensation structure 2 and the compensated dual-gate transistor, but the pixel unit 1 is not limited to the structure shown in FIG. 4.

Dual-gate transistors have better electrical performance than conventional transistors, for example, a leakage current of the double-gated transistor is typically lower.

However, the part of the active region 52 of the dual-gate transistor between the two gates 51 (i.e., the intermediate part 521) does not correspond to a gate, and thus may be irradiated by light incident from the outside, which may affect the performance of the dual-gate transistor and further affect displaying.

By disposing the compensation structure 2 on the same side of the active region 52 as the gates 51, the intermediate part 521 of the active region 52 is covered by the compensation structure 2 to be kept from being irradiated.

Meanwhile, since the compensation structure 2 overlaps the intermediate part 521 of the dual-gate transistor, the compensation structure 2 and the intermediate part 521 form a capacitor, so that a change of a voltage in the compensation structure 2 causes a change of a voltage in the intermediate part 521 through induction, which also affects displaying. Therefore, the compensation structure 2 should be connected to the constant voltage terminal to stabilize the voltage in the compensation structure 2, that is, a voltage of one terminal of the capacitor is fixed, so that the capacitor can stabilize the voltage of the intermediate part 521 of the dual-gate transistor, thereby improving the display effect.

With reference to FIG. 1, the redundant pixel units 11 (Dummy Pixels) are located on the positions closest to the second side of the array (e.g., the rightmost column in FIG. 1). In fact, the redundant pixel units 11 are not configured to perform display.

In the display substrate in the present disclosure, the pixel units 1 except the redundant pixel units 11 should be pixel units 1 (regular pixel units 12) capable of performing display.

That is, positions for a column of pixel units may be set aside on the second side (the right side in FIG. 1) of the array of the regular pixel units 12 actually used for display, and are used for disposing a column of the redundant pixel units 11, which may protect the regular pixel units 12 and facilitate layout design, but are not actually used for display.

Specific implementations of the redundant pixel units 11 which are not actually used for display are various.

For example, if the pixel unit 1 performs display with an OLED taken as a light-emitting device, the redundant pixel unit 11 may be such configured that the OLED of the redundant pixel unit 11 lacks one or more of a cathode, a light emitting layer and an anode, thereby being incapable of emitting light; or, the redundant pixel unit 11 may be such configured that a Pixel Defining Layer (PDL) thereof has no openings, so that the light-emitting layer of the redundant pixel unit 11 is not in contact with one of the cathode and the anode, thereby being incapable of emitting light.

As another example, the redundant pixel unit 11 may lack one or more structures (such as transistors, leads, etc.) compared to the regular pixel unit 12, or the leads may be disconnected at some positions, so that the circuit of the redundant pixel unit 11 cannot perform a display function.

It should be understood that, in the above two ways, the redundant pixel unit 11 lacks a part of the structures compared with the regular pixel unit 12, so that the redundant pixel unit 11 has no display function (since the compensation structure 2 has no direct relation with the display function, the redundant pixel unit 11 must have the compensation structure 2); however, for a structure which both the redundant pixel unit 11 and the regular pixel unit 12 have, a relative position, shape, size and layer of the structure in the redundant pixel unit 11 are the same as those of the corresponding structure in the regular pixel unit 12.

Specifically, in an implementation of the present disclosure, the redundant pixel unit 11 may be provided with only one constant voltage terminal and the compensation structure 2 (in which case the redundant pixel unit 11 is still regarded as a pixel unit 1).

As another example, it may be configured that signals (e.g., data voltage) are not input to the redundant pixel unit 11, so that the redundant pixel unit 11 is incapable of performing display. Specifically, the redundant pixel unit 11 may not be connected to a corresponding signal port (e.g., a port of a driver chip), or the corresponding signal port may not output a signal.

As another example, the redundant pixel unit 11 may be hidden by other additional structures, so that the redundant pixel unit 11 is not seen by a user although the redundant pixel unit 11 is capable emitting light, thereby being actually incapable of performing display.

With reference to FIG. 1, since the compensation structure 2 of each pixel unit 1 compensates for the dual-gate transistor of the adjacent pixel unit 1 relative to the first side (e.g., the left side), the dual-gate transistors of most of the regular pixel units 12 actually used for display can be compensated.

However, since the regular pixel units 12 closest to the second side (e.g., the rightmost side) do not have adjacent regular pixel units with respect to the second side, the dual-gate transistors in those regular pixel units 12 are not compensated by the compensation structures 2 of the other regular pixel units 12. Thus, in some related techniques, the regular pixel units 12 closest to the second side (e.g., the rightmost side) are different from the other regular pixel units 12 if no redundant pixel units are provided, that is, the intermediate parts 521 of the dual-gate transistors of the regular pixel units 12 closest to the second side (e.g., the rightmost side) are not hidden and no capacitors are formed, so that the regular pixel units 12 closest to the second side (e.g., the rightmost side) are also different from the other regular pixel units 12 in display effect, which further causes poor display (for example, a dark line appears at the rightmost side).

In the present disclosure, the redundant pixel units 11 (provided with the compensation structures 2) are provided to compensate for the dual-gate transistors in the regular pixel units 12 closest to the second side (e.g., the right side in FIG. 1), so that the intermediate parts 521 of the dual-gate transistors in the regular pixel units 12 at all positions can be hidden and same capacitors can be formed, and thus performance of transmitted signals is the same, which avoids the difference in the display effects of the regular pixel units 12, that is, avoids the poor display; and since the redundant pixel units 11 do not perform display at all, the display effect is not affected by the fact that the dual-gate transistors in the redundant pixel units 11 are not compensated.

In the present disclosure, the plurality of pixel units 1 in the array are arranged in rows and columns; each row of pixel units 1 is connected to one gate line 91, and each column of pixel units 1 is connected to one data line 92; a direction from the first side to the second side is parallel to a direction of the rows; and the pixel units 1 in the column closest to the second side are redundant pixel units 11.

Specifically, with reference to FIG. 1, the plurality of pixel units 1 may be arranged in the array in rows and columns, and the first side and the second side are two sides (e.g., the left side and the right side in FIG. 1) along the direction of the rows, then the redundant pixel units 11 are the pixel units 1 in the column closest to the second side (e.g., the rightmost column of pixel units 1 in FIG. 1).

Further, the gate lines 91 in the display substrate may extend in the direction of the rows, and the data lines 92 may extend in a direction of the columns. Thus, each row of pixel units 1 is connected to one gate line 91 (e.g., a gate line terminal GATE of the pixel unit 1 is connected to the gate line 91), and each column of pixel units 1 is connected to one data line 92 (e.g., a data terminal DATA of the pixel unit 1 is connected to the data line 92).

It should be understood that the direction of the rows and the direction of the columns are merely two intersection directions, and are not necessarily related to the location and the state of the display substrate.

In the present disclosure, each pixel unit 1 further includes a first constant voltage terminal VDD, a second constant voltage terminal VSS, and a driving transistor TD and a light-emitting device EL which are connected in series between the first constant voltage terminal VDD and the second constant voltage terminal VSS; the driving transistor TD is configured to control a current flowing through the driving transistor TD according to a voltage of a gate of the driving transistor TD; and the light-emitting device EL of the redundant pixel unit 11 does not have a light emitting function.

Figure 6:
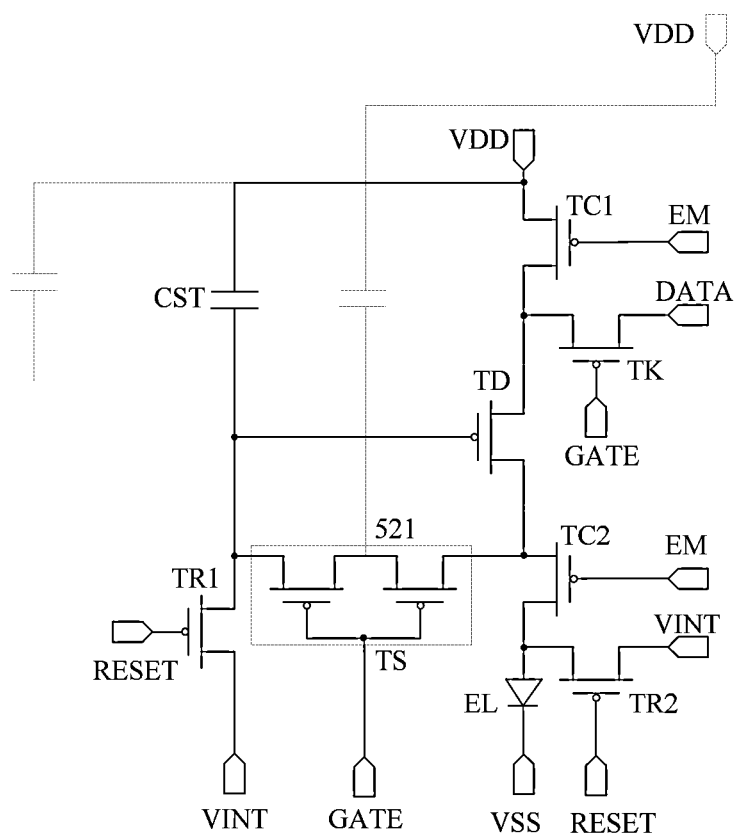
FIG. 6 is a schematic diagram of an equivalent circuit structure of a pixel unit in a display substrate according to the present disclosure.

With reference to FIG. 6, each pixel unit 1 may be provided with the driving transistor TD and the light-emitting device EL which are connected in series between the first constant voltage terminal VDD and the second constant voltage terminal VSS. The first constant voltage terminal VDD and the second constant voltage terminal VSS are configured to supply an operating voltage to enable the light-emitting device EL to emit light, for example, the first constant voltage terminal VDD supplies a high voltage, and the second constant voltage terminal VSS supplies a low voltage. Thus, by controlling the voltage of the gate of the driving transistor TD, the current flowing through the driving transistor TD may be controlled, and thus luminous brightness of the light-emitting device EL may be controlled, so as to enable the pixel units 1 to display the desired content.

The light-emitting devices EL in the redundant pixel units 11 may do not have a light emitting function.

In the present disclosure, the light-emitting device EL is an OLED.

Further, the light-emitting device EL may be specifically in the form of OLED, that is, the display substrate may be an array substrate of an OLED display.

In the present disclosure, the compensation structure 2 is connected to the first constant voltage terminal VDD of the pixel unit 1 where the compensation structure 2 is located.

In the present disclosure, the compensation structure 2 is connected to the second constant voltage terminal VSS of the pixel unit 1 where the compensation structure 2 is located.

In an implementation of the present disclosure, the compensation structure 2 may be connected to the first constant voltage terminal VDD or the second constant voltage terminal VSS to obtain a fixed voltage, that is, the compensation structure 2 may be connected to the first constant voltage terminal VDD or the second constant voltage terminal VSS.

It is also possible that the compensation structure 2 is connected to another constant voltage terminal in the pixel unit 1.

In the present disclosure, each pixel unit 1 includes a first dual-gate transistor TS; a first electrode of the first dual-gate transistor TS is connected to the gate of the driving transistor TD; and the first dual-gate transistor TS is configured to transmit a data voltage to the gate of the driving transistor TD.

Except the redundant pixel units 11, the first dual-gate transistor TS of each pixel unit 1 is compensated by the compensation structure 2.

With reference to FIG. 6, at least one of the transistors of each pixel unit 1, which has one terminal connected to the gate of the driving transistor TD, is the dual-gate transistor (i.e., the first dual-gate transistor TS), and the first dual-gate transistor TS is configured to transmit the data voltage (from the data line terminal DATA) to the gate of the driving transistor TD to control the current in the driving transistor TD, that is, to control displaying.

The first dual-gate transistor TS is compensated by the compensation structure 2 (i.e., the compensation structure 2 of the pixel unit 1 adjacent to the first dual-gate transistor TS with respect to the second side), that is, the intermediate part 521 of the first dual-gate transistor TS overlaps and is insulated from the compensation structure 2.

Since the first dual-gate transistors TS directly affect the voltages of the gates of the driving transistors TD, that is, directly affects the displaying, it is necessary to compensate for the transistors in the case where the transistors are dual-gate transistors.

It should be understood that the pixel unit 1 may be provided with other transistors (e.g., a first reset transistor TR1) which are dual-gate transistors, and those dual-gate transistors may be compensated by the compensation structures 2 or not.

In the present disclosure, a second electrode of the first dual-gate transistor TS is connected to a second electrode of the driving transistor TD.

With reference to FIG. 6, the compensated first dual-gate transistor TS may be connected between the second electrode and the gate of the driving transistor TD, in which case the transistor is more likely to affect the display effect of the pixel unit 1 and thus needs to be compensated to stabilize a state thereof.

In the present disclosure, each pixel unit 1 further includes a data terminal DATA, a gate line terminal GATE, a control terminal EM, a switch transistor TK, a first control transistor TC1, a second control transistor TC2, and a storage capacitor CST; the first control transistor TC1 includes a gate connected to the control terminal EM, a first electrode connected to the first constant voltage terminal VDD, and a second electrode connected to a first electrode of the driving transistor TD; the second control transistor TC2 includes a gate connected to the control terminal EM, a first electrode connected to the second electrode of the driving transistor TD, and a second electrode connected to a first electrode of the light-emitting device EL; a second electrode of the light-emitting device EL is connected to the second constant voltage terminal VSS; the switch transistor TK includes a gate connected to the gate line terminal GATE, a first electrode connected to the first electrode of the driving transistor TD, and a second electrode connected to the data terminal DATA; gates (two gates) of the first dual-gate transistor TS are connected to the gate line terminal GATE; and the storage capacitor CST includes a first electrode connected to the first constant voltage terminal VDD, and a second electrode connected to the gate of the driving transistor TD.

More specifically, with reference to FIG. 6, the first dual-gate transistor TS may be connected to the data terminal DATA through the driving transistor TD and the switch transistor TK to write the data voltage to the gate of the driving transistor TD.

In the present disclosure, each pixel unit 1 further includes an initial signal terminal VINT, a reset terminal RESET, a first reset transistor TR1, and a second reset terminal TR2; the first reset terminal TR1 includes a gate connected to the reset terminal RESET, a first electrode connected to the gate of the driving transistor TD, and a second electrode connected to the initial signal terminal VINT; and the second reset terminal TR2 includes a gate connected to the reset terminal RESET, a first electrode connected to the first electrode of the light-emitting device EL, and a second electrode connected to the initial signal terminal VINT.

Reference may be made to FIG. 6 for a specific form of the pixel unit 1 in the display substrate according to the present disclosure. In the pixel unit 1, the first dual-gate transistor TS overlaps the compensation structure 2, and the compensation structure 2 is connected to the constant voltage terminal (such as the first constant voltage terminal VDD or the second constant voltage terminal VSS in the another pixel unit 1), so that a capacitor (shown by the dotted line in FIG. 6) is formed and connected between the intermediate part 521 of the first dual-gate transistor TS and the constant voltage terminal.

Figure 7:
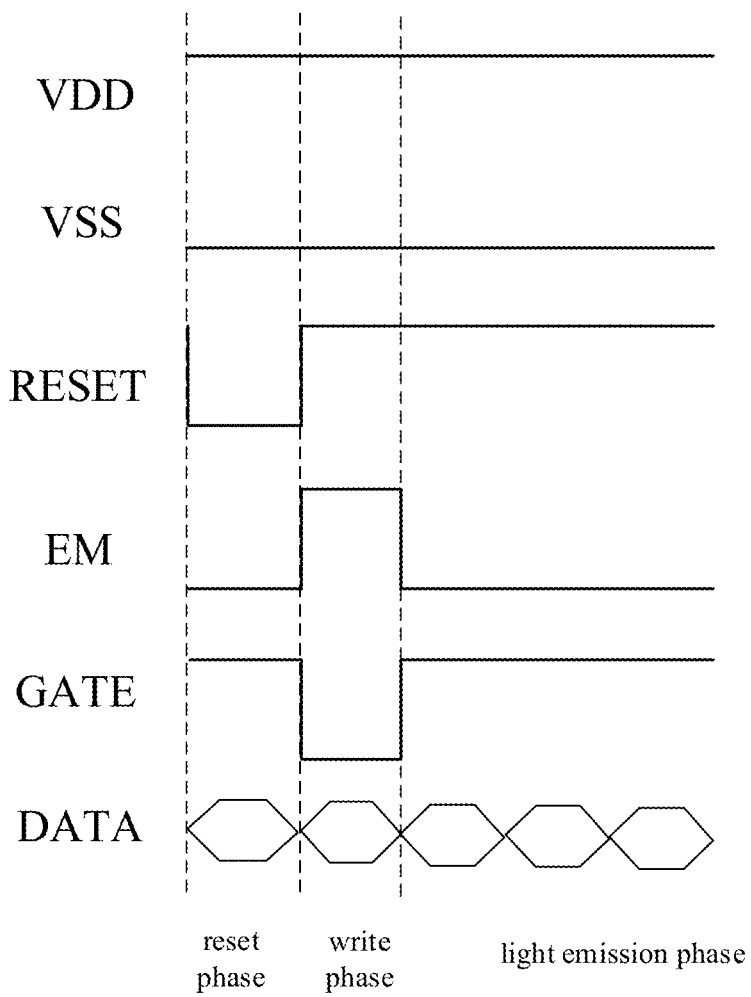
FIG. 7 is a schematic diagram illustrating driving timing of a pixel unit in a display substrate according to the present disclosure.

For example, in a driving process of each pixel unit 1 in the above form, a high voltage is continuously supplied to the first constant voltage terminal VDD, a low voltage is continuously supplied to the second constant voltage terminal VSS, and an initial voltage is continuously supplied to the initial signal terminal VINT. With reference to FIG. 7, the driving process may specifically include the following operations S101 to S103.

Operation S101, a reset phase, in which an OFF signal is supplied to the gate line terminal GATE (connected to the gate line 91), an ON signal is supplied to the reset terminal RESET, and an ON signal is supplied to the control terminal EM.

The ON signal is a signal which enables the transistor to be turned on when applied to the gate of the transistor; and the OFF signal is a signal which enables the transistor to be turned off when applied to the gate of the transistor.

In the present disclosure, a P-type transistor is taken as an example of the transistor for description, so the ON signal is a low-voltage signal, and the OFF signal is a high-voltage signal.

It should be understood that the ON signal is a high-voltage signal, and the OFF signal is a low-voltage signal in a case where the transistor is an N-type transistor.

Therefore, in this phase, the gate and the second electrode of the driving transistor TD are both reset to the signal (e.g., the initial voltage) of the initial signal terminal VINT; and the first electrode of the driving transistor TD is applied with a high-voltage signal from the first constant voltage terminal VDD.

Operation S102, a write phase, in which an ON signal is supplied to the gate line terminal GATE, an OFF signal is supplied to the reset terminal RESET, an OFF signal is supplied to the control terminal EM, and a data voltage is supplied to the data terminal DATA (connected to the data line 92).

In this phase, the data voltage for the pixel unit 1 is written into the gate of the driving transistor TD through the switch transistor TK, the driving transistor TD, and the first dual-gate transistor TS, so that a voltage of the gate of the driving transistor TD is a value related to both the data voltage and a threshold voltage Vth of the driving transistor TD, one terminal of the storage capacitor CST is applied with the high voltage of the first constant voltage terminal VDD, and the other terminal is applied with the voltage of the gate of the driving transistor TD.

Operation S103, a light emission phase, in which an OFF signal is supplied to the gate line terminal GATE, an OFF signal is supplied to the reset terminal RESET, and an ON signal is supplied to the control terminal EM.

In this phase, the terminal (the second electrode) of the storage capacitor CST connected to the gate of the driving transistor TD is in a floating state, so that a previous voltage difference is maintained between the two terminals of the storage capacitor CST, which may eliminate drifting of the threshold voltage of the driving transistor TD so as to accurately control the current flowing through the driving transistor TD. Therefore, the light-emitting device EL (e.g., the OLED) can continuously emit light according to intensity corresponding to the data voltage to perform display until the reset stage in a next frame begins.

As can be known from simulation calculation, for each pixel unit 1, when the first dual-gate transistor TS is compensated by the compensation structure 2 at a certain data voltage, the current I flowing through the driving transistor TD in this phase is I=4.76 pA; and if the first dual-gate transistor TS is not compensated by the compensation structure 2, the current I' flowing through the driving transistor TD in this phase is I'=3.16 pA.

It can be seen that I' is significantly less than 1, that is, the current flowing through the driving transistor TD is reduced when the first dual-gate transistor TS is not compensated by the compensation structure 2, which may reduce the brightness of the light-emitting device EL, thereby affecting the display effect.

Figure 8:
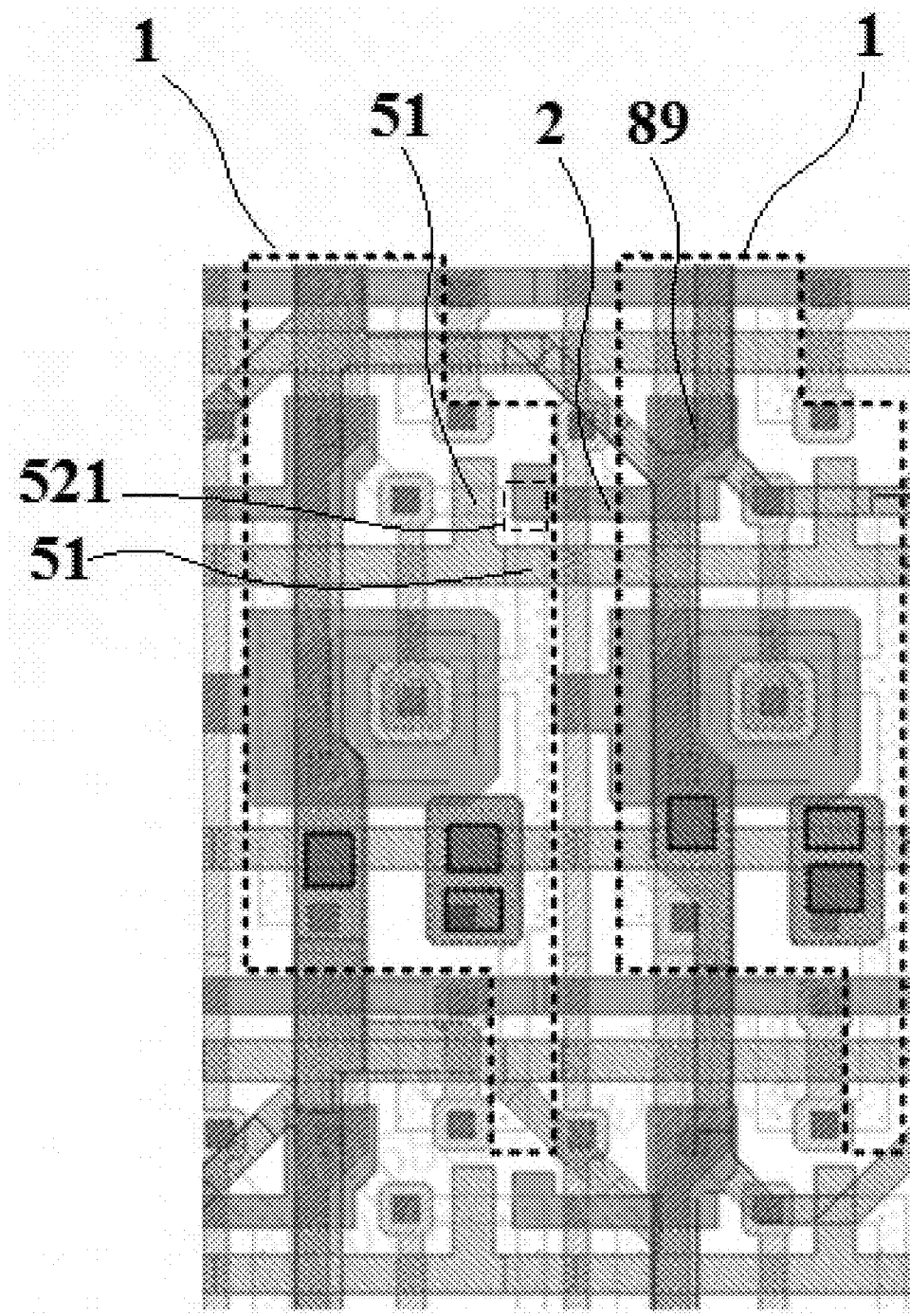
FIG. 8 is a top view of a part of a structure of a part of pixel units in a display substrate according to the present disclosure.

Illustratively, reference may be made to FIG. 8 for a specific layout of all the structures in the pixel unit 1.

The two gates 51 of the dual-gate transistor (the first dual-gate transistor TS) are located below step structures on the upper right sides of the boundaries (the large dashed boxes in FIG. 8) of the pixel unit 1, and the intermediate part 521 of the active region 52 between the two gates 51 has a corner-like shape, and the compensation structure 2 enters the pixel unit 1 from the right side and overlaps the intermediate part 521; specifically, the compensation structure 2 is connected to a lead, which is connected to the first constant voltage terminal VDD, through a via 89.

From the perspective of an overlapping relationship, with reference to FIG. 4 and FIG. 8, the active region of each transistor may be directly arranged on the base substrate 8 and be covered by the gate insulating layer 81.

The gate line 91, the gate line terminal GATE, the gate of each transistor, and the first electrode of the storage capacitor CST (which is also the gate of the driving transistor TD) are disposed on the gate insulating layer 81 and covered by the first interlayer insulating layer 82.

The second electrode of the storage capacitor CST and the compensation structure 2 are disposed on the first interlayer insulating layer 82 and covered by the second interlayer insulating layer 83.

The source and the drain (the first electrode and the second electrode) of each transistor, the data line 92, the data terminal DATA, and the first constant voltage terminal VDD are disposed on the second interlayer insulating layer 83.

Thus, the first constant voltage terminal VDD and the compensation structure 2 are connected through the via 89 in the second interlayer insulating layer 83; and the other structures located on different layers may also be connected through vias in the corresponding insulating layers if the connections are necessary.

The above layout design avoids unnecessary overlapping, so as to allow for convenient introduction of the compensation structure 2 into the adjacent pixel unit 1.

It should be understood that the above layout design is merely exemplary, and the location, size, shape, layer and connection mode of each structure of the pixel unit 1 may be implemented in different ways.

It should be understood that the specific form of the pixel unit 1 in the display substrate according to the present disclosure may vary, and the number and the connection mode of the transistors therein may be different; and the dual-gate transistors among the transistors may be different, and the dual-gate transistors compensated by the compensation structures 2 may also be different.

In a second aspect, the present disclosure provides a display device, including the display substrate described above.

That is, the above display substrate may be combined with other devices (e.g., an opposite substrate, housing, a driver circuit, a power supply and the like) to form a display device having a complete display function.

In the present disclosure, the display device further includes a frame disposed on a light emitting side of the display substrate.

An orthographic projection of the frame on the display substrate covers the redundant pixel units, but does not overlap the other pixel units except the redundant pixel units.

In general, a display device may have a visible frame on a light emitting side (a display side), and the frame is a part of the housing and is disposed around a display region. In the present disclosure, the redundant pixel units cannot actually perform display, so that the redundant pixel units may be hidden by the frame. Meanwhile, the frame exposes the other pixel units (i.e., the regular pixel units), and thus does not affect the actual display effect.

The present disclosure discloses the exemplary embodiments using specific terms, but the terms are merely used and should be merely interpreted as having general illustrative meanings, rather than for the purpose of limitation. Unless expressly stated otherwise, it is apparent to those of ordinary skill in the art that features, characteristics and/or elements described in connection with a particular embodiment can be used alone or in combination with features, characteristics and/or elements described in connection with other embodiments. Therefore, it should be understood by those of ordinary skill in the art that various changes in the forms and the details can be made without departing from the scope of the present disclosure of the appended claims.

What is claimed is:

1. A display substrate, comprising a base substrate and a plurality of pixel units arranged in an array on the base substrate, with the array having a first side and a second side, which are opposite to each other, wherein each pixel unit comprises at least one constant voltage terminal and at least one dual-gate transistor, each dual-gate transistor comprises two gates which are spaced apart, and a part of an active region of the dual-gate transistor, which is located between the two gates, is an intermediate part;

except the pixel units closest to the first side, each pixel unit further comprises a compensation structure, the compensation structure is connected to one constant voltage terminal of the pixel unit where the compensation structure is located, and compensates for the at least one dual-gate transistor of a pixel unit adjacent to the pixel unit where the compensation structure is located in a direction toward the first side;

the compensation structure overlaps and is insulated from the intermediate part of the dual-gate transistor for which the compensation structure compensates, and the compensation structure and the two gates of the dual-gate transistor for which the compensation structure compensates are located on a same side of the active region of the dual-gate transistor with respect to the base substrate; and the pixel units closest to the second side are redundant pixel units which are not used for display.

2. The display substrate of claim 1, wherein each pixel unit further comprises a first constant voltage terminal, a second constant voltage terminal, and a driving transistor and a light-emitting device which are connected in series between the first constant voltage terminal and the second constant voltage terminal;

the driving transistor is configured to control a current flowing through the driving transistor according to a voltage of a gate of the driving transistor; and the light-emitting device of the redundant pixel unit does not have a light emitting function.

3. The display substrate of claim 2, wherein
the light-emitting device is an organic light-emitting diode.

4. The display substrate of claim 2, wherein
the compensation structure is connected to the first constant voltage terminal of the pixel unit where the compensation structure is located.

5. The display substrate of claim 2, wherein
the compensation structure is connected to the second constant voltage terminal of the pixel unit where the compensation structure is located.

6. The display substrate of claim 2, wherein
each pixel unit comprises a first dual-gate transistor, a first electrode of the first dual-gate transistor is connected to the gate of the driving transistor, and the first dual-gate transistor is configured to transmit a data voltage to the gate of the driving transistor; and except the redundant pixel units, the first dual-gate transistor of each pixel unit is compensated by the compensation structure.

7. The display substrate of claim 6, wherein
a second electrode of the first dual-gate transistor is connected to a second electrode of the driving transistor.

8. The display substrate of claim 7, wherein each pixel unit further comprises a data terminal, a gate line terminal, a control terminal, a switch transistor, a first control transistor, a second control transistor, and a storage capacitor;

the first control transistor comprises a gate connected to the control terminal, a first electrode connected to the first constant voltage terminal, and a second electrode connected to a first electrode of the driving transistor;

the second control transistor comprises a gate connected to the control terminal, a first electrode connected to the second electrode of the driving transistor, and a second electrode connected to a first electrode of the light-emitting device;

a second electrode of the light-emitting device is connected to the second constant voltage terminal;

the switch transistor comprises a gate connected to the gate line terminal, a first electrode connected to the first electrode of the driving transistor, and a second electrode connected to the data terminal;

gates of the first dual-gate transistor are connected to the gate line terminal; and the storage capacitor comprises a first electrode connected to the first constant voltage terminal, and a second electrode connected to the gate of the driving transistor.

9. The display substrate of claim 8, wherein each pixel unit further comprises an initial signal terminal, a reset terminal, a first reset transistor, and a second reset terminal;

the first reset terminal comprises a gate connected to the reset terminal, a first electrode connected to the gate of the driving transistor, and a second electrode connected to the initial signal terminal; and the second reset terminal comprises a gate connected to the reset terminal, a first electrode connected to the first electrode of the light-emitting device, and a second electrode connected to the initial signal terminal.

10. The display device of claim 9, wherein each pixel unit of the display substrate further comprises an initial signal terminal, a reset terminal, a first reset transistor, and a second reset terminal;

the first reset terminal comprises a gate connected to the reset terminal, a first electrode connected to the gate of the driving transistor, and a second electrode connected to the initial signal terminal; and the second reset terminal comprises a gate connected to the reset terminal, a first electrode connected to the first electrode of the light-emitting device, and a second electrode connected to the initial signal terminal.

11. The display substrate of claim 1, wherein
the plurality of pixel units in the array are arranged in rows and columns;

each row of pixel units is connected to one gate line, and each column of pixel units is connected to one data line;

a direction pointing from the first side to the second side is parallel to a direction of the rows; and the pixel units in the column closest to the second side are the redundant pixel units.

12. A display device, comprising:
the display substrate of claim 1.

13. The display device of claim 12, further comprising:
a frame disposed on a light emitting side of the display substrate;

wherein an orthographic projection of the frame on the display substrate covers the redundant pixel units, but does not overlap the other pixel units except the redundant pixel units.

14. The display device of claim 12, wherein each pixel unit of the display substrate further comprises a first constant voltage terminal, a second constant voltage terminal, and a driving transistor and a light-emitting device which are connected in series between the first constant voltage terminal and the second constant voltage terminal;

the driving transistor is configured to control a current flowing through the driving transistor according to a voltage of a gate of the driving transistor; and the light-emitting device of the redundant pixel unit does not have a light emitting function.

15. The display device of claim 14, wherein the light-emitting device is an organic light-emitting diode.

16. The display device of claim 14, wherein the compensation structure is connected to the first constant voltage terminal of the pixel unit where the compensation structure is located.

17. The display device of claim 14, wherein the compensation structure is connected to the second constant voltage terminal of the pixel unit where the compensation structure is located.

18. The display device of claim 14, wherein each pixel unit of the display substrate comprises a first dual-gate transistor, a first electrode of the first dual-gate transistor is connected to the gate of the driving transistor, and the first dual-gate transistor is configured to transmit a data voltage to the gate of the driving transistor; and except the redundant pixel units, the first dual-gate transistor of each pixel unit is compensated by the compensation structure.

19. The display device of claim 18, wherein a second electrode of the first dual-gate transistor is connected to a second electrode of the driving transistor.

20. The display device of claim 19, wherein each pixel unit of the display substrate further comprises a data terminal, a gate line terminal, a control terminal, a switch transistor, a first control transistor, a second control transistor, and a storage capacitor;

the first control transistor comprises a gate connected to the control terminal, a first electrode connected to the first constant voltage terminal, and a second electrode connected to a first electrode of the driving transistor;

the second control transistor comprises a gate connected to the control terminal, a first electrode connected to the second electrode of the driving transistor, and a second electrode connected to a first electrode of the light-emitting device;

a second electrode of the light-emitting device is connected to the second constant voltage terminal;

the switch transistor comprises a gate connected to the gate line terminal, a first electrode connected to the first electrode of the driving transistor, and a second electrode connected to the data terminal;

gates of the first dual-gate transistor are connected to the gate line terminal; and the storage capacitor comprises a first electrode connected to the first constant voltage terminal, and a second electrode connected to the gate of the driving transistor.

* * * * *